United States Patent
Krikke et al.

(10) Patent No.: US 6,583,855 B2
(45) Date of Patent: Jun. 24, 2003

(54) LITHOGRAPHIC APPARATUS, DEVICE MANUFACTURING METHOD, AND DEVICE MANUFACTURED THEREBY

(75) Inventors: Jan Jaap Krikke, Best (NL); Markus Franciscus Antonius Eurlings, Breda (NL); Jan Hoegee, Eindhoven (NL); Paul van der Veen, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 09/897,720

(22) Filed: Jul. 3, 2001

(65) Prior Publication Data

US 2002/0036763 A1 Mar. 28, 2002

(30) Foreign Application Priority Data

Jul. 5, 2000 (EP) .............................................. 00305666

(51) Int. Cl.$^7$ ........................ G03B 27/54; G03B 27/42; G03B 27/72
(52) U.S. Cl. ............................ 355/67; 355/53; 355/69
(58) Field of Search ........................... 355/52–53, 55, 355/67–71; 356/399–401; 250/548; 359/618–619

(56) References Cited

U.S. PATENT DOCUMENTS

| | | | | |
|---|---|---|---|---|
| 5,452,054 A | * | 9/1995 | Dewa et al. | 355/67 |
| 5,572,287 A | * | 11/1996 | Wangler et al. | 355/53 |
| 5,675,401 A | | 10/1997 | Wangler | 355/67 |
| 6,285,443 B1 | * | 9/2001 | Wangler et al. | 355/67 |
| 6,295,122 B1 | * | 9/2001 | Schultz et al. | 355/67 |
| 6,392,742 B1 | * | 5/2002 | Tsuji | 355/67 |
| 6,476,905 B1 | * | 11/2002 | Li | 355/71 |

FOREIGN PATENT DOCUMENTS

EP 0747772 12/1996

* cited by examiner

*Primary Examiner*—Henry Hung Nguyen
(74) *Attorney, Agent, or Firm*—Pillsbury Winthrop LLP

(57) ABSTRACT

A lithographic projection system has an optical element provided in the illumination system for changing an elliptically symmetric intensity anomaly of the projection beam in a pupil of the projection apparatus, the optical element being rotated about the optical axis of the projection apparatus such that the change in intensity anomaly introduced by it counteracts an elliptically symmetric intensity anomaly present in the projection beam or introduced by another optical element traversed by the projection beam.

25 Claims, 6 Drawing Sheets

LITHOGRAPHIC APPARATUS, DEVICE MANUFACTURING METHOD, AND DEVICE MANUFACTURED THEREBY

BACKGROUND OF THE INVENTION

1. Field of the Invention

The present invention relates generally to a lithographic projection apparatus and specifically to a lithographic projection apparatus including corrective optics to reduce ellipticity error.

2. Description of the Related Art

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus commonly—referred to as a step-and-scan apparatus—each target portion is irradiated by progressively scanning the mask pattern under the projection beam in a given reference direction (the Y direction or "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Also herein, the invention is described using a reference system of orthogonal X, Y and Z directions. Further, unless the context otherwise requires, the term "vertical" used herein is intended to refer to the direction normal to the substrate or the plane comprising the pattern (as provided by the patterning structure) or parallel to the optical axis of an optical system, rather than implying any particular orientation of the apparatus. Similarly, the term "horizontal" refers to a direction parallel to the substrate surface or the surface of a pattern, as generated by the patterning structure, or perpendicular to the optical axis, and thus normal to the "vertical" direction. In particular, the horizontal direction corresponding with said scanning direction will be referred to as the Y direction.

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Correct imaging of a pattern generated by a patterning structure in a lithographic projection apparatus requires correct illumination of the patterning structure; in particular it is important that the intensity of illumination proximal the plane of the pattern, as generated by the patterning structure, or proximal planes conjugate to said plane of the pattern be uniform over the area of the exposure field. Also, it is generally required that the patterning structure can be illuminated with off-axis illumination in a variety of modes such as, for example, annular, quadrupole or dipole illumination, to improve resolution; for more information on the use of such illumination modes see, for example, EP 1 091 252, incorporated herein by reference. Said illumination modes are, for example, obtained by providing a corresponding preselected intensity distribution in a pupil of the illumination system. To meet above-mentioned requirements, the illumination system of a lithographic projection system is generally quite complex. A typical illumination system might include: shutters and attenuators for controlling the intensity of the beam output by the source, which might be a high pressure Hg lamp or an excimer laser; a beam shaping element such as, for example, a beam expander for use with an excimer laser radiation beam to lower the radiation beam divergence; a zoomable axicon pair and a zoom lens for setting the illumination mode and parameters (collectively referred to as a zoom-axicon); an integrator, such as a quartz rod, for making the intensity distribution of the beam more uniform; masking blades for defining the illumination area; and imaging optics for projecting an image of the exit of the integrator onto the patterning structure. For simplicity, the plane of the pattern generated by the patterning structure, and planes conjugate to this plane in the radiation system and the projection system may be referred to hereinafter as "image" planes. The illumination system may also include elements intended to correct non-uniformities in the illumination beam at or near image planes. For instance the illumination system may include diffractive optical elements to improve the match of the projection beam cross-section proximal the entrance face of the integrator rod with the shape of said entrance face. A diffractive optical element typically consists of an array of microlenses, which may be Fresnel lenses or Fresnel zone plates. Improving said match alleviates the problem of field dependent lithographic errors occurring in the patterned layer. Said matching may hereinafter be referred to as "filling" of the integrator entrance face. A diffractive optical element may also be positioned, for example, in front of a beam shaping element, such as a zoom-axicon, to transform the angular distribution of radiation provided by an excimer laser beam into a preselected angular distribution of radiation for generating a desired illumination mode. For more information on illumination systems such as mentioned here, see for example EP 0747772 and U.S. Pat. No. 5,675,401, incorporated herein by reference.

Also, the illumination system may, for instance, include a filter partially transmissive to radiation of the projection beam with a preselected spatial distribution of transmittance, immediately before the plane of the pattern, to reduce spatial intensity variations.

However, known illumination systems still suffer from various problems. In particular, various of the elements used, especially diffractive optical elements and quartz-rod integrators, can introduce an anomaly of intensity distribution in a plane perpendicular to the optical axis of the radiation system or the projection system. For instance, in a plane proximal a pupil of the radiation system or the projection system, either the projection beam cross-section may be elliptical rather than circular, or the projection beam intensity distribution within the projection beam cross-section may, for instance, be elliptically symmetric rather than circularly symmetric. Both types of errors are referred to as "ellipticity of the projection beam" or simply as "ellipticity error", and typically lead to specific lithographic errors in said patterned layers. In particular, a patterned feature occurring in directions parallel to both the X and Y direction may exhibit, in the presence of ellipticity of the projection beam, different sizes upon exposure and processing. Such a lithographic error is usually referred to as H–V difference. Also, a diffractive optical element used to improve filling of the integrator is generally only optimum for one setting of the zoom-axicon. For other settings, the integrator entrance face may be under-filled (the projection beam cross-section is smaller than the integrator entrance face), leading to substantial field dependent H–V difference. For said other settings, the integrator entrance face may also be over-filled, leading to energy wastage. Also, 157 nm excimer lasers and other excimer lasers tend to have large divergence differences in X and Y directions which cannot be completely resolved using beam expander lenses while keeping the shape of the beam within acceptable dimensions.

SUMMARY OF THE INVENTION

It is an object of the present invention to provide an improved illumination system for use in a lithographic projection apparatus, and particularly an illumination system in which the ellipticity of the projection beam can be controlled or reduced and the filling of the integrator entrance face can be controlled, to alleviate the problem of H–V difference.

This and other objects are achieved according to the invention in a lithographic apparatus as specified in the opening paragraph, characterized by correction means for correcting an intensity anomaly of said intensity distribution, wherein the intensity anomaly comprises two elongated sections distributed along said X and Y direction, respectively, having substantially different intensities, and wherein said correction means comprises an optical element rotatable around the optical axis of said projection apparatus.

It is recognized in this invention that an optical element causing ellipticity of the projection beam may be rotated around the optical axis of the system comprising said optical element to counteract any ellipticity caused by another element traversed by the projection beam.

Ellipticity of the projection beam may, for instance, be corrected by a diffractive optical element provided in the illumination system. An illumination system may of course include more than one diffractive optical element. Dependant on the source and extent of the ellipticity in the projection beam, the diffractive optical element may be rotated to an appropriate angle to make use of any inherent ellipticity or may be manufactured with a specific degree of ellipticity, e.g. by making each microlens in an array asymmetric. Preferably the diffractive optical element completely removes ellipticity or reduces it to an acceptable level. The invention can thus provide a lithographic projection apparatus in which the rotational position of a diffractive optical element is oriented to counteract an ellipticity error.

It is another aspect of the present invention to provide a radiation filter which is partially transmissive to the projection beam radiation, with a transmittance distribution which counteracts an ellipticity error caused by other optical elements traversed by the projection beam. Typically, such a radiation filter will have an inherent elliptically symmetric transmittance distribution. In particular, such a partially transmissive radiation filter arranged in series with a supplementary partially transmissive radiation filter, both rotatable around the optical axis of said projection apparatus, can be used as means to generate and adjust an amount of counteracting ellipticity, as needed to compensate ellipticity caused by said other optical elements.

The present invention also provides a lithographic projection apparatus comprising:
- a radiation system for providing a projection beam of radiation, said radiation system comprising an illumination system for adjusting angular and spatial energy distributions of said projection beam and for providing a preselected intensity distribution of said projection beam in a pupil of said illumination system;
- a support structure for supporting patterning structure, the patterning structure serving to pattern the projection beam according to a desired pattern;
- a substrate table for holding a substrate and being movable along X and Y directions in an X, Y-coordinate system defined in said apparatus;
- a projection system for projecting the patterned beam onto a target portion of the substrate, and for projecting said intensity distribution onto a pupil of the projection system,
- wherein said illumination system comprises an integrator; characterized by:
- a diffractive optical element located before said integrator and comprising an array of microlenses, said array of microlenses having a focal plane comprising the focal points of said microlenses, and a diffractive plate element, said diffractive plate element being situated proximal said focal plane of said array of microlenses and comprising a pair of substantially parallel plates proximal each other, said parallel plates having a refractive power varying sinusoidally at substantially the same pitch as said array of microlenses.

The diffractive plate element may be used to control filling of the integrator entrance face by adjusting the positions of said parallel plates proximal each other along at least one direction substantially perpendicular to the optical axis of the illumination system for different zoom-axicon settings, thereby avoiding under- and over-filling. The substantially transparent parallel plates proximal each other may be made of quartz and the sinusoidal refractive power can be provided by giving the opposed faces of the plates a sinusoidal profile in one or two orthogonal directions.

According to another aspect of the invention there is provided a method of setting up a lithographic projection apparatus comprising:
- a radiation system for providing a projection beam of radiation, said radiation system comprising an illumination system for adjusting angular and spatial energy distributions of said projection beam and for providing a preselected intensity distribution of said projection beam in a pupil of said illumination system;
- a support structure for supporting patterning structure, the patterning structure serving to pattern the projection beam according to a desired pattern;
- a substrate table for holding a substrate and being movable along X and Y directions in an X, Y-coordinate system defined in said apparatus;
- a projection system for projecting the patterned beam onto a target portion of the substrate, and for projecting said intensity distribution onto a pupil of the projection system,
- the method comprising the steps of providing correction means for correcting an intensity anomaly of said intensity distribution, wherein the intensity anomaly comprises two elongated sections distributed along said X and Y direction, respectively, having substantially different intensities, and adjusting the rotational position of at least one optical element, rotatable around the optical axis of said projection apparatus and comprised in said correction means, such that said anomaly is substantially compensated.

According to a further aspect of the invention there is provided a device manufacturing method using a lithographic projection apparatus comprising the steps of:
- providing a substrate that is at least partially covered by a layer of radiation-sensitive material;
- providing a projection beam of radiation using a radiation system;
- using patterning structure to endow the projection beam with a pattern in its cross-section;
- projecting the patterned beam of radiation onto a target portion of the layer of radiation-sensitive material, characterized by the steps of:
- providing correction means for correcting an intensity anomaly of an intensity distribution in a cross-section of the projection beam proximal a pupil selected from the group of pupils comprising a pupil of said radiation system and a pupil of said projection system, wherein the intensity anomaly comprises two elongated sections distributed along two mutually perpendicular directions, respectively having substantially different intensities, the rotational position of at least one optical element, rotatable around the optical axis of said projection apparatus and comprised in said correction means, being oriented such that said anomaly is substantially compensated.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Embodiment 1

Figure 1:
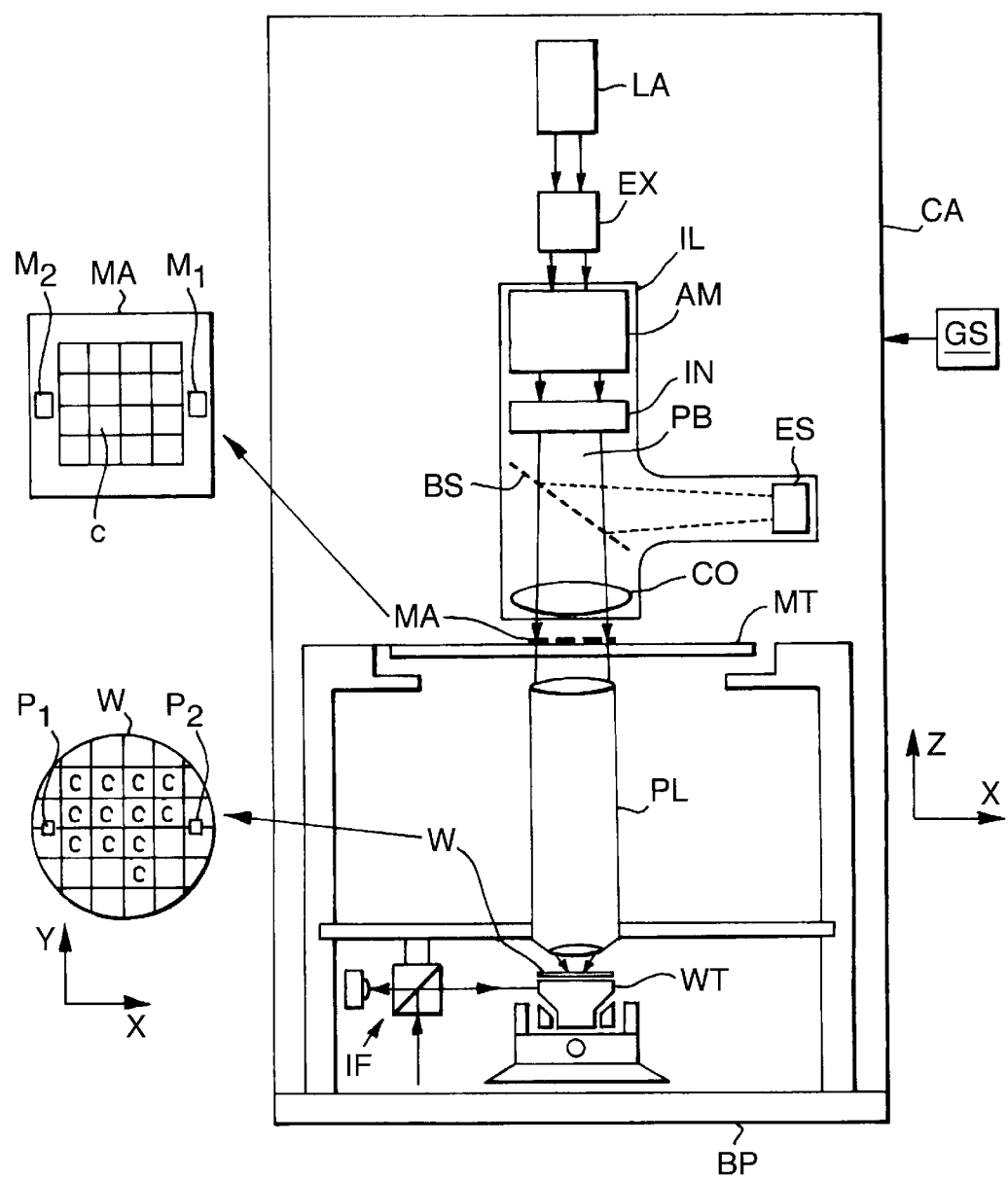
FIG. 1 depicts a lithographic projection apparatus according to a first embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. UV radiation). In this particular case, the radiation system also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a quartz and/or $CaF_2$ lens system or a catadioptric system comprising lens elements made from such materials, or a mirror system) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a Hg lamp, an excimer laser, a laser or discharge plasma source or an undulator provided around the path of an electron beam in a storage ring or synchrotron which produces a beam of radiation) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. The settings of σ-outer and σ-inner (the "sigma settings") affect the angular distribution of the radiation energy delivered by said projection beam at, for instance, the substrate. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA which held on a mask table MT. Having traversed the mask MA, the beam PB is caused to traverse the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. The reference signs M1, M2 correspond to reticle alignment marks and the references P1 and P2 correspond to wafer alignment marks. These marks are used to respectively align the wafer and the reticle respective to each other. In general, movement of the object tables MT, WT will be realized with the aid of a long stroke module (course positioning) and a short stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the X and/or Y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the Y direction)

with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

In the illumination system IL, a part of the projection beam PB is diverted to an energy sensor ES by a beam splitter BS. Beam splitter BS may be a reflector formed by depositing aluminum on quartz and used to fold the projection beam to a convenient orientation. A pattern of small holes is etched into the aluminum layer so that only a known (relatively small) proportion of energy, e.g. 1%, is diverted to the energy sensor. The output of the energy sensor is used in controlling the dose delivered in an exposure.

Particularly in the case where radiation of wavelength 157 nm or below is used, the entire optical path of the apparatus is enclosed in one or more casings CA which can be flushed with a gas, e.g. dry $N_2$, transparent to the radiation used for the projection beam. The flushing, or purge, gas is supplied from gas supply GS which may be a container of clean gas or a plant for scrubbing and drying air, for example.

Figure 2:
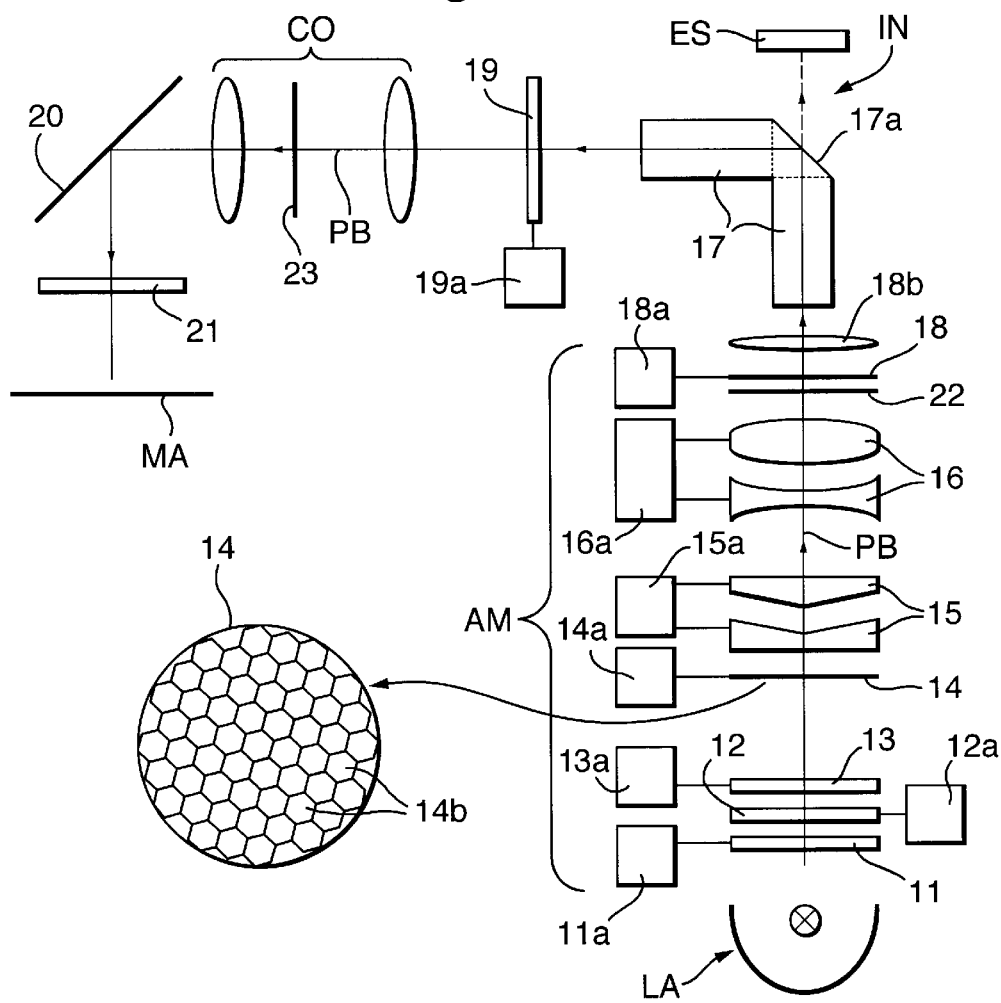
FIG. 2 is a more detailed view of the illumination system of the first embodiment of the invention.

FIG. 2 shows in greater detail the optical path of the projection beam from radiation source LA to mask MA. The radiation source LA in this embodiment is a high-pressure Hg lamp provided with an elliptical reflector to collect the output radiation, but it may also be a laser. Two shutters are provided to control the output of the lamp: a safety shutter 11 held open by a coil 11a and arranged to close automatically if any of the panels of the machine casing are opened; and a rotary shutter 12 driven by motor 12a for each exposure. A second rotary shutter 13 driven by motor 13a and having a light attenuating filter in the shutter aperture may be provided for low-dose exposures.

Beam shaping is principally performed by the axicon 15 and zoom lens 16, which are adjustable optical elements driven by respective servo systems 15a, 16a. These components are referred to collectively as the zoom-axicon. The axicon 15 includes a concave conical lens and complementary convex conical lens whose separation is adjustable. Setting the two elements of the axicon 15 together provides conventional circular illumination, while moving them apart creates an annular illumination distribution.

The zoom lens 16 determines the size of the illumination beam or the outer radius of an annular illumination mode. Pupil shaping means (not shown) may be inserted, for instance, in the exit pupil 22 of the zoom-axicon module to provide quadrupole or other illumination modes.

A first diffractive optical element (DOE) 14 is provided to evenly fill the axicon 15. The diffractive optical element 14 comprises a closely packed array of (e.g. hexagonal) microlenses 14b, shown in the enlargement, which expand the beam and help define the pupil shape in, for instance, the pupil 22. Alternative forms of DOE include holographic DOEs, which use phase shifts to define a desired pupil shape and the desired energy distribution within the beam cross-section. The diffractive optical element may be one of a plurality of elements selectively interposable into the beam by exchanger 14a. Exchanger 14a may be arranged to adjust the position and orientation of the diffractive element in the beam PB.

The integrator IN in this case comprises two elongate quartz rods 17 joined at a right-angle prism 17a, the hypotenuse surface of which is partially silvered to allow a small, known proportion of the beam energy through to the energy sensor ES. The projection beam PB undergoes multiple internal reflections in the quartz rods 17 so that, looking back through it, there is seen a plurality of spaced apart virtual sources, thus evening out the intensity distribution of the projection beam. Note though that since the sides of the quartz rod are parallel to the optical axis, the limited illumination angles in annular, quadrupole or dipole illumination modes are preserved, as is the effective numerical aperture of the illumination system.

A second diffractive optical element 18 and coupling optics 18b are used to couple the light from the zoom-axicon into the quartz rod 17 and improve filling of it. The second diffractive optical element 18 may also be an array of suitably shaped (e.g. rectangular) micro-lenses or a hologram and may be adjustable or interchangeable under the control of exchanger 18a. Preferably, said second DOE 18 is located proximal a pupil such as, for example, pupil 22.

Close after the exit of the integrator IN are the reticle masking blades 19, which are used to define the illumination area, i.e. the area of the reticle to be illuminated. There are four separate reticle masking blades 19, which are individually driven by servo system 19a. The four blades are metal and have a wedge-shaped leading edge so as to direct stray light away from the reticle masking orifice.

The condensing optics CO form an objective lens for imaging the reticle masking orifice, via an intermediate pupil 23, on the reticle (mask). A folding mirror 20 is included for convenient location of the illumination system in the apparatus, and a gradient filter 21 is included to correct for known intensity variations.

Various of the optical elements in the illumination system can, in spite of all efforts to avoid this, introduce ellipticity errors into the projection beam PB. As explained above, ellipticity errors may cause, for instance, a lithographic error known as H—V difference. According to the invention, the first and/or second diffractive optical element 14, 18 is (are) rotatable and/or provided with a controlled ellipticity, as explained below, to compensate for ellipticity errors introduced by other elements in the optical system.

Figure 3A:
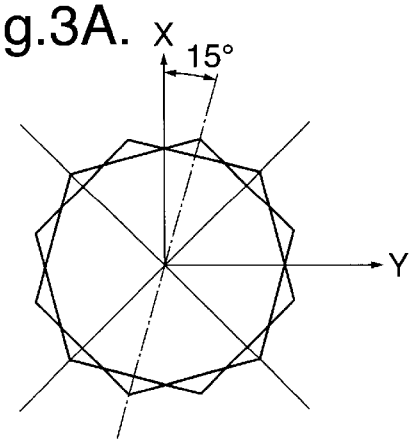
FIGS. 3A and 3B are diagrams showing the effect of rotation of microlenses in a diffractive optical element.
Figure 3B:
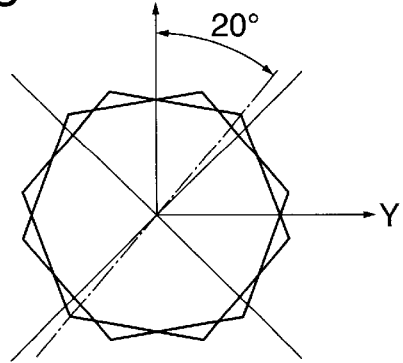

FIG. 3A shows an intensity distribution in pupil 23, defining the shape of pupil 23, when using a conventional diffractive element 14 with hexagonal microlenses. This diffractive optical element comprises a hexagonal array of hexagonal microlenses each rotated 15° with respect to the X direction, about the optical axis, to provide a star-shaped pupil form with zero ellipticity. In principle, the intensity distribution in pupil 23 is a sum of two substantially uniform intensity distributions, each distribution being hexagonally shaped, and where, due to reflections in the integrator rod 17, one distribution is rotated 15° clockwise and the other distribution is rotated 15° counter clockwise with respect to the X direction. As a result the radial extents along the X and Y axes of the resulting intensity distribution are substantially equal, and hence no ellipticity error is introduced by DOE 14. However, as shown in FIG. 3B, by rotating the whole diffractive optical element, the ellipticity of the pupil shape in pupil 23 can be changed. In FIG. 3B, the angle of rotation with respect to the X axis of the diffractive optical element is increased by 5° with respect to the conventional 15° orientation defined above (so that it is rotated 20° with respect to the X direction), causing a noticeable ellipticity. Approximately 0.3–0.4% ellipticity offset is caused by a 1° increase of rotation of the diffractive optical element.

Accordingly therefore, the ellipticity errors caused by the illumination optical system as a whole and the diffractive optical element 14 are measured, and the diffractive optical element rotated to compensate. It is noted that while a rotation of the diffractive optical element by 90°, or a multiple of 90°, ought to have no effect on the magnitude of the ellipticity, in practice there can be a noticeable change in ellipticity. Such changes, known as apodisation, can be made use of in the present invention, which accordingly encompasses rotations of multiples of 90° as well as rotations of the order of a few degrees.

In variations of the first embodiment of the invention, the diffractive optical elements may be manufactured with non-regular hexagonal microlenses, stretched along one axis to introduce a predetermined ellipticity error to correct for ellipticity error caused by other elements.

Where the diffractive optical elements are hologram lenses, an ellipticity effect to correct for ellipticity error introduced by other elements can be deliberately introduced. The desired correction, and the necessary form of the hologram lens(es), can be calculated by computer. The hologram lens may, for example, generate an intensity distribution with circular shape and with an elliptically symmetric intensity anomaly to compensate for an ellipticity error caused by another element traversed by the projection beam.

In principle, it is often sufficient to only correct the so-called "dipole number". The dipole number represents the proportion of radiation energy in the quadrants along the X direction relative to the radiation energy in the quadrants along the Y direction, in a pupil plane. A value of 100% indicates equal energy in each set of quadrants. Optical elements introducing ellipticity error also affect said dipole number, and hence, can be used to correct said dipole number in accordance with the invention.

Embodiment 2

Figure 4:
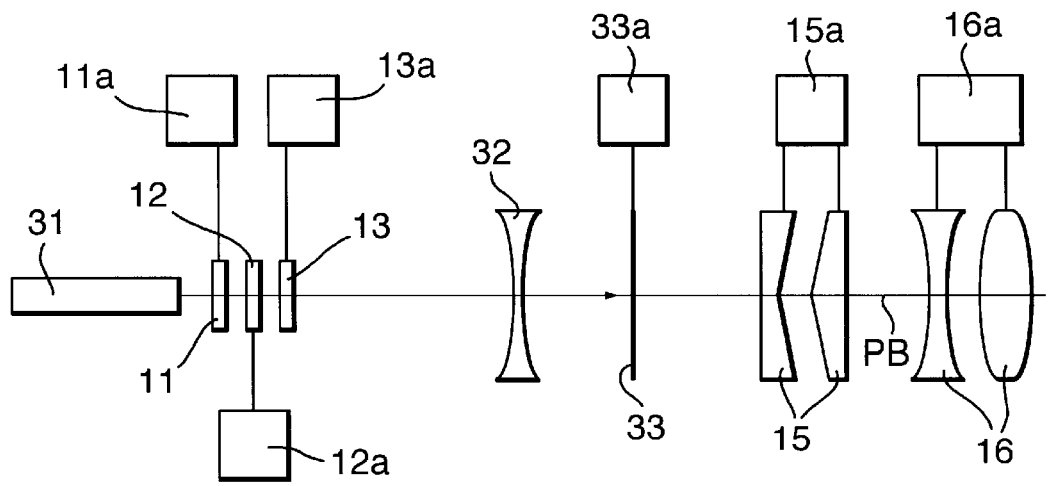
FIG. 4 is a diagram showing a part of the illumination system in a second embodiment of the invention.

In a second embodiment of the invention, which may be the same as the first embodiment save as described below, a laser light source is used. FIG. 4 shows the first few components of the illumination system of the second embodiment.

The laser 31 outputs a relatively narrow, collimated beam which passes through shutters 11, 12, 13 as in the first embodiment. It is then passed through beam divergence optics 32 which expand the beam to a convenient size, e.g. 30 mm×30 mm in cross-section. Ideally, the beam expander 32 should output a collimated beam; however, at the edges of the beam there may be a divergence difference of up to 15 mrad between the X and Y directions (where the Z direction is the optical axis of the beam). In the second embodiment, the beam expanding optics are arranged to provide correct divergence in one direction, e.g. the Y direction, concentrating the divergence error in the other direction, e.g. the X direction, which is then corrected for by the diffractive optical element 33.

The diffractive optical element 33 is, for example, an array of positive hexagonal elements of width 0.25 mm and radius 2.6 mm, oriented at 15° with respect to the X axis, as shown in FIGS. 2 and 3A. This basic configuration is then modified to correct the divergence difference of the laser beam. The modification necessary to effect this will depend on the specific apparatus in which the invention is used and in particular the characteristics of the remainder of the illumination system. In one example of the second embodiment the X divergence can be corrected by reducing the width of the hexagonal microlenses in the X direction as follows:

| X divergence (mrad) | X size (mm) |
|---|---|
| 0 | 0.250 |
| 3 | 0.249 |
| 6 | 0.248 |
| 9 | 0.246 |
| 12 | 0.242 |

As in the first embodiment, in the second embodiment of the invention it may be sufficient only to correct the dipole number. Changing the shape of the elements of the diffractive optical element 33 can affect the shape of the beam cross-section at the entrance to the zoom-axicon 15, 16 but such change is very small, even for large divergence values, and can be neglected.

The diffractive optical element 33 may be mounted on an exchanger 33a allowing different elements to be interposed in the beam for different effects, and allowing the orientation of such element to be adjusted so as to effect correction in accordance with the invention.

Embodiment 3

In a third embodiment said elliptical error of the projection beam is corrected by providing in the path of the projection beam a filter which is partially transmissive to radiation of the projection beam, whereby said partially transmissive filter has a transmission distribution which counteracts said ellipticity error.

Figure 5:
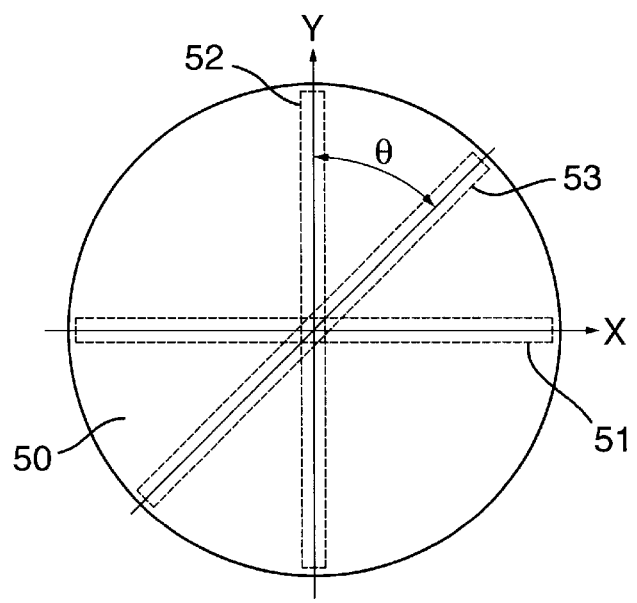
FIG. 5 is a diagram showing a cross section of the projection beam, a coordinate system relative to said cross section, and elongated sections within said cross section.

In principle a single partially transmissive filter proximal a pupil plane of the projection apparatus (such as for example the planes 22 or 23 in FIG. 2) can provide the necessary counteracting effect. In principle, an intensity distribution I typical of ellipticity error can be represented by $$I=Io(1-Ia\cos(2\theta)) \quad (1)$$

where Io is an average intensity in the pupil and Iα cos(2θ) is an intensity anomaly of the intensity distribution. This anomaly varies according to an angle θ (in radians) defining a direction with respect to the Y axis, as illustrated in FIG. 5, and Ia is a dimensionless amplitude of variation. Generally, Iα is of the order of a few percent; Iα may, for example, be 0.03. In FIG. 5, item 50 is a cross section of the projection beam, centered with respect to the optical axis of the projection apparatus, in a pupil plane parallel to the X and Y directions. The intensity distribution comprises two elongated sections 52 and 51, distributed along the Y- and X direction, respectively, having substantially different intensities; in accordance with equation (1) these different intensities are substantially to the intensities at θ=0 and θ=π/2 respectively, so that in section 52 the intensity is, to good approximation, Io(1+Iα), and in section 51 the intensity is, to good approximation, Io(1−Iα). Similarly, intensities in a plurality of elongated sections 53, centered at the optical axis and distributed along a corresponding plurality of directions defined by a corresponding plurality of angles θ, are to good approximation given by equation (1).

Figure 6:
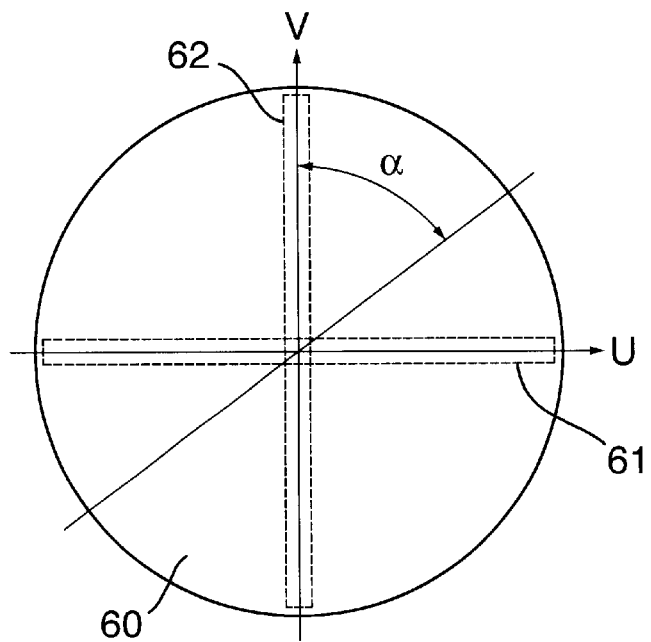
FIG. 6 is a diagram showing a partially transmissive radiation filter in a third embodiment, a coordinate system relative to said filter, and elongated sections comprised in said filter.

A transmittance distribution of a partially transmissive radiation filter providing a counteracting effect for alleviating said ellipticity error (and hence, for alleviating said H–V difference) is defined with respect to an orthogonal U, V-coordinate system (see FIG. 6), thought of as fixed with respect to the radiation filter 60. A transmittance distribution may, for example, be given by $$T=To(1-I\alpha-I\alpha\cos(2\alpha)) \quad (2)$$

where To is a (maximum) first transmittance in a first elongated section 61 along the U direction, and where To(1−2Ia) is a (minimum) second transmittance in a second elongated section 62 along the V direction. The transmittance varies according to an angle α (in radians) defining a direction with respect to the V axis; see FIG. 6. A partially transmissive radiation filter with a transmittance distribution given by equation (2) can be provided in the projection beam path as, for example, a substantially transparent patterned plate. The pattern of said patterned plate may, for example, comprise greytone dithered opaque dots (blocking radiation of the projection beam), distributed over the surface with varying spatial density, said spatial density varying in accordance with equation (2). Such a radiation filter can be positioned in the plane of cross section 50 with the X, Y-coordinate system and the U, V-coordinate system juxtaposed in registry. The resulting intensity distribution of the projection beam, upon traversing the embodied partially transmissive radiation filter, is denoted hereinafter by Ir. In this embodiment Ir is given by $$Ir=T\cdot I=To(1-I\alpha-I\alpha\cos(2\theta))Io(1+I\alpha\cos(2\theta))=ToIo(1-I\alpha-I\alpha^2\cos(2\theta)-I\alpha^2\cos^2(2\theta)) \quad (3)$$

Here the terms quadratic in Ia can be ignored with respect to 1, so that the resulting intensity distribution is substantially independent of the angle θ (i.e., the ellipticity error is corrected for):

$$Ir \approx ToIo(1-I\alpha). \quad (4)$$

Figure 7:
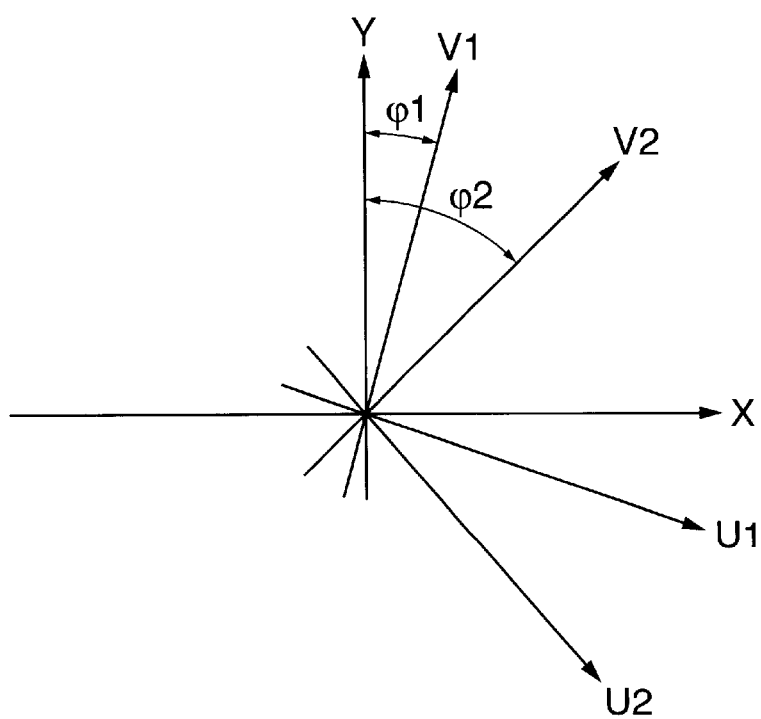
FIG. 7 shows coordinate systems relative to a cross section of the projection beam, and relative to two partially transmissive radiation filters.

Generally, the ellipticity error may vary in time due to, for instance, a gradual contamination of an optical element or due to a gradual irreversible interaction between the radiation of the projection beam and for instance the material of an optical element. Although typically such an interaction may lead to an increase of ellipticity error beyond tolerance only after a substantial number of exposures, it is desirable to provide the projection apparatus with means to adjust the transmittance distribution of said partially transmissive radiation filter such as to be able to correct for a drift of ellipticity error. A preferred embodiment of said means comprises a first partially transmissive radiation filter as described above, and a second, supplementary partially transmissive radiation filter, where both partially transmissive radiation filters are rotatable around the optical axis of said projection apparatus, and where both partially transmissive radiation filters are arranged in series in the path of the projection beam. The transmission distribution of each filter may, for instance, be given by $$T1=To(1-(I\alpha/2)-(I\alpha/2)\cos(2\alpha 1))$$

$$T2=To(1-(I\alpha/2)-(I\alpha/2)\cos(2\alpha 2)) \quad (5)$$

in a U1, V1-coordinate system and a U2, V2-coordinate system respectively, each coordinate system fixed with respect to the corresponding partially transmissive radiation filter. Here, To is a (maximum) first transmittance in a first elongated section along the U1 direction for the first filter, and along the U2 direction for the second filter, and in analogy with the above described filter the transmittances of the first and second filter vary in accordance with an angle α1 and α2 (in radians) defining a direction with respect to the V1 and V2 axes, respectively. The rotational orientation of the first and second filter with respect to the X, Y coordinate system in the beam cross section 50 is defined by angles of rotation Φ1 and Φ2 respectively; see FIG. 7. The resulting transmission distributions T1 and T2 with respect to the X, Y coordinate system, for said first and second filter, respectively, are given by:

$$T1=To(1-(I\alpha/2)-(I\alpha/2)\cos(2\theta-\Phi 1))=To(1-(I\alpha/2)-(I\alpha/2)\cos(2\theta)\cos\Phi 1-(I\alpha/2)\sin(2\theta)\sin\theta 1) \quad (6)$$

and $$T2=To(1-(I\alpha/2)-(I\alpha/2)\cos(2\theta-\Phi 2))=To(1-(I\alpha/2)-(I\alpha/2)\cos(2\theta)\cos\Phi 2-(I\alpha/2)\sin(2\theta)\sin\Phi 2) \quad (7)$$

One or more motors can be provided for applying rotations Φ1 and Φ2 to the filters. It is generally preferred to couple the rotation Φ1 to the rotation Φ2 in the sense that the equation:

$$\Phi 2=\Phi 1 \quad (8)$$

is substantially satisfied. So, when the first filter rotates clockwise, the second filter rotates counterclockwise. Such a coupling can readily be provided by means of a transmission gear assembly. The transmittance distribution T12 of the two filters in series is given by the product of T1 and T2:

$$T12=To^2(1-I\alpha-I\alpha\cos\Phi 1\cos(2\Phi)) \quad (9)$$

where equations (6), (7) and (8) are taken into account and where the terms quadratic in Ia are ignored with respect to 1. With a setting of rotational positions as described by $$\Phi 1=-\Phi 2=\pi/2,$$

the resulting transmittance T12 is given by T12=To²(1=Iα). Hence it is independent of θ so that this setting of rotational positions is suitable in the absence of an ellipticity error. The setting of rotational positions as described by Φ1=Φ2=0 enables, to good approximation (i.e. ignoring effects of second and higher order in Iα), the correction of an intensity anomaly with a dimensionless amplitude Iα as present in the intensity distribution described by equation (1). Other settings enable, similarly, the correction of intensity anomalies with a dimensionless amplitude 2Iα cos Φ1, so that a tuning of Φ1 results in a tuning of the ellipticity error.

Besides a rotation in opposite directions (Φ1=−Φ2) of the partially transmissive radiation filters, as described above, the rotations may comprise, for example, a rotation in the same rotational direction. This will change the rotational orientation in the X, Y plane of a first and second elongated section, both centered at the optical axis, where the transmittance distribution of T12 has a maximum and a minimum transmittance respectively.

Preferably, the two filters are located proximal pupil 23 of the condensing optics CO in FIG. 2, so that an ellipticity error caused by, for instance, the integrator 17 can be counteracted. Ellipticity errors may be dependent on illumination settings, and this dependence can be measured. A corresponding table of optimal rotational settings for Φ1 and Φ2 can be calculated and stored in storage means, so that an appropriate correction for ellipticity error can be applied during operation of the lithographic projection apparatus.

Embodiment 4

Figure 8:
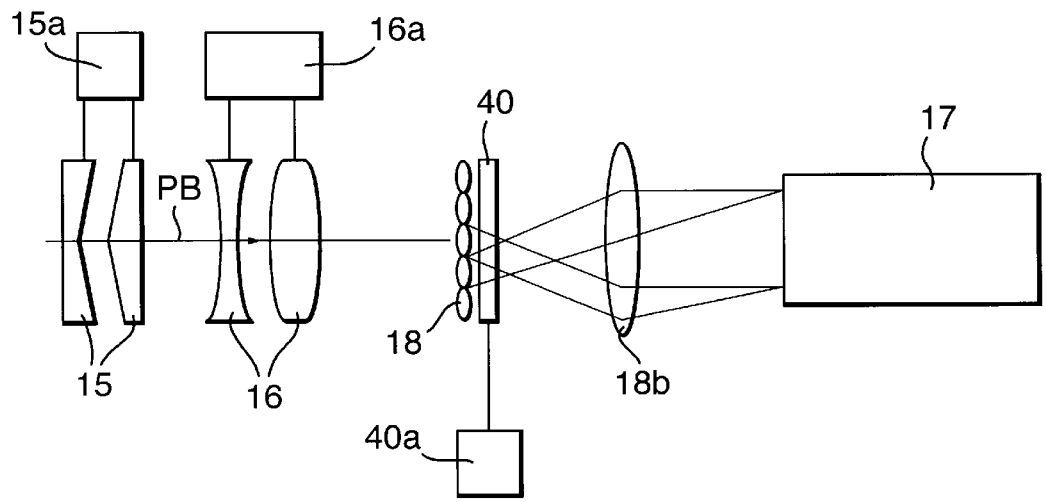
FIG. 8 is a diagram showing a part of the illumination system of a fourth embodiment of the invention.

In a fourth embodiment of the invention, which may be the same as the first, second or third embodiment save as described below, an adjustable plate element 40 is introduced to enable optimum filling of the entrance face of the integrator 17 for different settings of the zoom-axicon 15, 16. FIG. 8 shows a part of the illumination system of the fourth embodiment, while FIGS. 9A, 9B, 10A, 10B and 10C are used to illustrate the effect of the adjustable plate element 40.

As shown in FIG. 8, the adjustable plate element 40 is placed between the diffractive optical element 18 and coupling optics 18b (which are used to couple the output of the zoom-axicon 15, 16 into the quartz rod 17) close to the focal plane of the diffractive optical element. The adjustable plate element 40 comprises two substantially transparent plates 41, 42 shown in FIG. 9B, which may be made of, for example, quartz. The opposing faces 41a, 42a of the plates 41 and 42 have complementary sinusoidal profiles. The gap 43 between the two faces is small, so that rays leaving the surface 41 a of the first plate 41 enter the second surface 42a of the second plate 42 with negligible displacement in a direction perpendicular to the direction of propagation of the radiation.

Figure 9A:
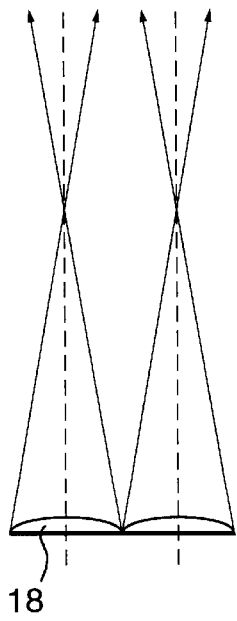
FIGS. 9A and 9B are diagrams showing the effect of an adjustable plate element of an embodiment of the invention.
Figure 9B:
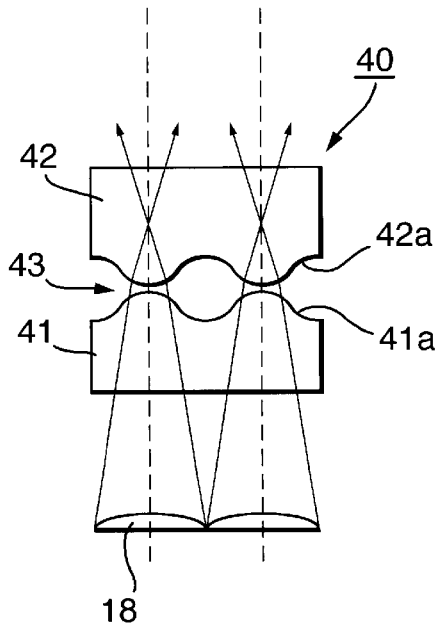

The rays will be refracted at the surfaces 41a and 42a. This is shown in FIG. 9B where it will be seen that the effect of the adjustable plate element is to shift the focal point as compared to the position without the adjustable plate element 40, shown in FIG. 9A. It should be noted that only parts of the adjustable plate have the effect of a positive lens, for which reason the adjustable plate element is placed near the focal plane of the second diffractive optical element 18 so that the parts of the adjustable plate that have the effect of a negative lens are not used.

Figure 10A:
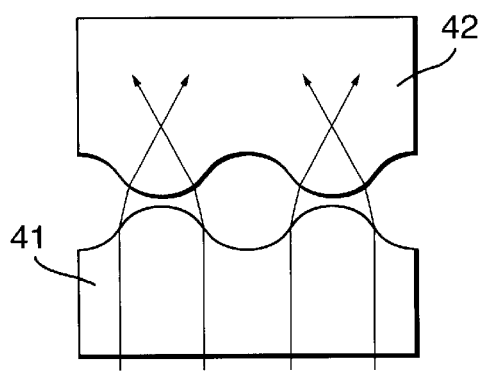
FIGS. 10A to 10C. are diagrams showing different effects achievable by adjustment of the adjustable plate element of the embodiment of the invention in FIGS. 9A and 9B.
Figure 10B:
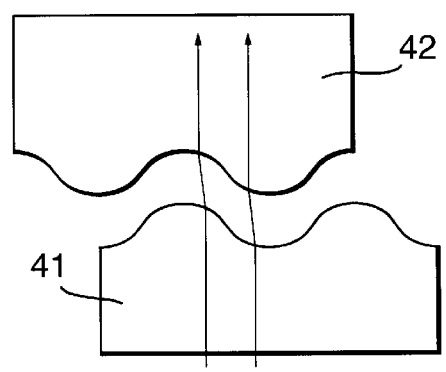
Figure 10C:
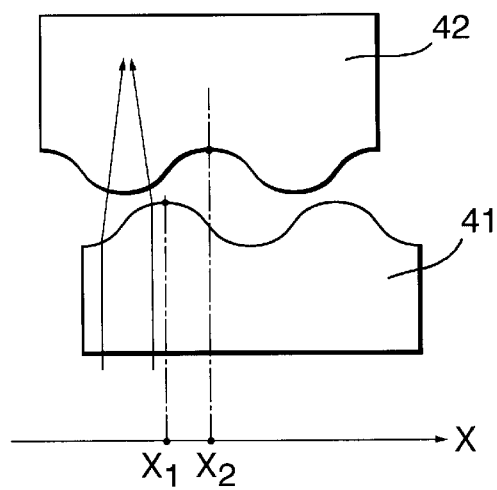

Whether the refractions at the two surfaces of the adjustable plate element add or cancel depends on the relative positions of the two plates 41, 42 along a "horizontal" direction substantially perpendicular to the direction of propagation of the projection beam. As shown in FIG. 10A, if the plates 41, 42 are aligned, the two refractions act in the same sense and combine so that the plate has maximum effect. As shown in FIG. 10B, if the plates 41, 42 are misaligned by half a period the refractions cancel, leaving the projection beam essentially unaffected. FIG. 10C shows the intermediate position whereby the plates are misaligned by less than half a period and so have a lesser converging effect. Note that in FIGS. 10A, 10B and 10C, the rays incident on the adjustable plate element are shown as being parallel and the refractive effects are exaggerated for clarity.

The dependence on position of the angular change caused by the adjustable plate element 40 can be derived as follows.

The angular change $\theta_1(x)$ and $\theta_2(x)$ caused by respectively the plate 41 and 42, can be expressed as follows:

$$\theta_1(x) = \theta_m \sin\left[(x - x_1) \cdot \frac{2\pi}{p}\right]$$

$$\theta_2(x) = \theta_m \sin\left[(x - x_2) \cdot \frac{2\pi}{p}\right]$$

In the above equations, x represents a position along a direction substantially perpendicular to the direction of propagation of the projection beam, and $x_1$ and $X_2$ are coordinates along a direction substantially perpendicular to the direction of propagation of the projection beam and defining positions of element 41 and 42, respectively. The definition of x, $x_1$ and $x_2$ is illustrated in detail in FIG. 10C. Further, p represents the period of the sinusoidal profile of the surfaces 41a, 42a and $\theta_m$ is the maximum angular change, determined by the refractive index of the plates 41, 42 and the amplitude of the sinusoidal profile.

Assuming the two plates are sufficiently close that the light rays are displaced by a negligible amount in the gap 43, the total angular change $\theta_T(x)$ can be derived as:

$$\theta_T(x) = \theta_1(x) + \theta_2(x)$$

$$= \theta_m \sin\left[\left(\frac{x_2}{2} - \frac{x_1}{2}\right) \cdot \frac{2\pi}{p}\right] \cdot \sin\left[\left(x - \frac{x_1}{2} - \frac{x_2}{2} + \frac{p}{4}\right) \cdot \frac{2\pi}{p}\right]$$

To position the plates 41, 42 relative to each other and the diffractive optical element 18, a servo-controlled positioning system 40a is provided. This may include sensors to detect alignment marks provided on the two plates to enable their relative positions to be accurately determined.

Fabrication of the plates may be done using known techniques such as wave interference of multiple exposure/etch steps or by greyscale lithography.

To control filling in two dimensions, the plates 41, 42 may be provided with a profile varying sinusoidally in two directions and be moveable in those two directions. Alternatively, two one-dimensional adjustable plate elements may be provided, one just before and one just after the focal plane of the second diffractive element 18.

While specific embodiments of the invention have been described above, it will be appreciated that the invention may be practiced otherwise than as described. The description is not intended to limit the invention.

What is claimed is:

1. A lithographic projection apparatus comprising:
   a radiation system to provide a projection beam of radiation, the radiation system comprising an illumination system, the illumination system being adjustable with respect to angular and spatial energy distributions of said projection beam and to provide a preselected intensity distribution of said projection beam in a pupil of said illumination system;
   a support structure to support patterning structure, the patterning structure serving to pattern the projection beam according to a desired pattern;
   a substrate table to hold a substrate and being movable along X and Y directions in an X, Y-coordinate system defined in said apparatus;
   a projection system to project the patterned beam onto a target portion of the substrate, and to project said intensity distribution onto a pupil of the projection system;
   an optical element rotatable around the optical axis of said projection apparatus to correct an intensity anomaly comprising two elongated sections distributed along said X and Y direction, respectively, and having different intensities.

2. Apparatus according to claim 1 wherein said optical element is a diffractive optical element.

3. Apparatus according to claim 2 wherein said optical element is one of a transmissive and a reflective optical element.

4. Apparatus according to claim 2 wherein said diffractive optical element comprises an array of microlenses.

5. Apparatus according to claim 4 wherein said array of microlenses is arranged such that a line joining respective centers of said microlenses is inclined relative to a reference direction perpendicular to an optical axis of said array at an angle in the range of from 15.5° to 20°.

6. Apparatus according to claim 4, wherein each of said microlenses is rotationally asymmetric about its center axis.

7. Apparatus according to claim 6 wherein each of said microlenses has a dimension in one of two orthogonal directions perpendicular to said optical axis in the range of from 94 to 99% of its dimension in the other orthogonal direction.

8. Apparatus according to claim 2 wherein said illumination system comprises an adjustable beam shaping element to define said preselected intensity distribution and said diffractive optical element is located before said adjustable beam shaping element.

9. Apparatus according to claim 2 wherein said radiation system comprises a beam expander to expand the radiation beam and the diffractive optical element is placed on an image side of the beam expander and is dimensioned to correct differences in the angle of divergence of the beam in different directions.

10. Apparatus according to claim 1 wherein said optical element is a partially transmissive radiation filter.

11. Apparatus according to claim 10 further comprising a supplementary partially transmissive radiation filter rotatable around the optical axis of said projection apparatus, and arranged in series with said partially transmissive radiation filter in the path of the projection beam.

12. An apparatus according to claim 1, wherein the support structure comprises a mask table for holding a mask.

13. An apparatus according to claim 1, wherein the radiation system comprises a radiation source.

14. A method of setting up a lithographic projection apparatus comprising:
 providing a substrate table to hold a substrate, said substrate table being movable along X and Y directions in an X, Y-coordinate system defined in said apparatus;
 providing at least one optical element to reduce an intensity anomaly of an intensity distribution,
 wherein the intensity anomaly comprises two elongated sections distributed along said X direction and Y direction, respectively, wherein the two sections have different intensities; and
 adjusting the rotational position of said at least one optical element around an optical axis of said projection apparatus such that said anomaly is substantially compensated.

15. A device manufacturing method using a lithographic projection apparatus comprising:
 providing a substrate that is at least partially covered by a layer of radiation-sensitive material;
 providing a projection beam of radiation using a radiation system;
 using patterning structure to endow the projection beam with a pattern in its cross-section;
 projecting the patterned beam of radiation onto a target portion of the layer of radiation-sensitive material; and
 correcting an intensity anomaly of an intensity distribution in a cross-section of the projection beam proximal a pupil selected from the group of pupils comprising a pupil of said radiation system and a pupil of said projection system, wherein the intensity anomaly comprises two elongated sections distributed along two mutually perpendicular directions, respectively having substantially different intensities, the correcting comprising setting a rotational orientation of at least one optical element such that said anomaly is substantially compensated.

16. A device manufactured according to the method of claim 15.

17. A lithographic projection apparatus comprising:
 a radiation system to provide a projection beam of radiation, the radiation system comprising an illumination system, the illumination system being adjustable with respect to angular and spatial energy distributions of said projection beam and to provide a preselected intensity distribution of said projection beam in a pupil of said illumination system;
 a support structure to support patterning structure, the patterning structure serving to pattern the projection beam according to a desired pattern;
 a substrate table to hold a substrate and being movable along X and Y directions in an X, Y-coordinate system defined in said apparatus;
 a projection system to project the patterned beam onto a target portion of the substrate, and to project said intensity distribution onto a pupil of the projection system; and
 an optical element rotatable around the optical axis of said projection apparatus to correct an intensity anomaly comprising two elongated sections distributed along said X and Y direction, respectively, and having different intensities,
 wherein said optical element comprises a partially transmissive radiation filter and a supplementary partially transmissive radiation filter, and the transmittance distribution of said partially transmissive radiation filter and said supplementary partially transmissive radiation filter comprise:
  a first elongated section distributed along a first direction, and centered at the optical
  axis, having a first transmittance, and a
  a second elongated section distributed along a second direction substantially orthogonal to said first direction, and centered at the optical axis, having a second transmittance different from said first transmittance, and
  a plurality of elongated sections centered at the optical axis and distributed along a corresponding plurality of directions at a corresponding plurality of angles $\alpha$ with one of said orthogonal directions, having a corresponding plurality of transmittances, with a gradual variation of transmittance between said first and second transmittance in accordance with said angle $\alpha$.

18. The apparatus according to claim 17,
wherein said variation of transmittance is a sinusoidal function of said angle $\alpha$.

19. The apparatus according to claim 18,
wherein said sinusoidal function of said angle $\alpha$. is given by $\cosine(2\alpha)$.

20. The apparatus according to claim 17,
wherein an axial position of at least one of said partially transmissive radiation filter and said supplementary partially transmissive radiation filter is substantially coincident with a position selected from the group of axial positions comprising the position of the pupil of the illumination system, the position of the pupil of the projection system, and the axial position of planes conjugate with said pupils.

21. A lithographic projection apparatus comprising:
a radiation system to provide a projection beam of radiation;
an illumination system, the illumination system being adjustable with respect to angular and spatial energy distributions of said projection beam and to provide a preselected intensity distribution of said projection beam in a pupil of said illumination system;

a support structure to support patterning structure, the patterning structure serving to pattern the projection beam according to a desired pattern;

a substrate table for holding a substrate and being movable along X and Y directions in an X, Y-coordinate system defined in said apparatus;

a projection system to project the patterned beam onto a target portion of the substrate, and for projecting said intensity distribution onto a pupil of the projection system;

an integrator comprising a portion of the illumination system; and a diffractive optical element located on an object side of said integrator and comprising an array of microlenses and a diffractive plate element, said array of microlenses having a focal plane comprising focal points of said microlenses and said diffractive plate element being situated proximate said focal plane of said array of microlenses and comprising a pair of substantially parallel plates proximate each other, said parallel plates having a refractive power varying sinusoidally at substantially a same pitch as said array of microlenses.

22. The apparatus according to claim 21,
wherein said refractive power of said pair of parallel plates varies sinusoidally in two orthogonal directions, perpendicular to the optical axis of said illumination system.

23. The apparatus according to claim 21 further comprising:
a second diffractive plate element situated proximate the focal plane of said array of microlenses, said second diffractive plate element comprising a pair of substantially parallel plates proximate each other, said parallel plates having a refractive power varying sinusoidally at substantially the same pitch as said array of microlenses, the refractive power of said second diffractive plate element varying in a direction orthogonal to the direction of variation of the refractive power of the other diffractive plate element.

24. The apparatus according to claim 21 further comprising:
at least one actuator to adjust positions of said parallel plates along at least one direction substantially perpendicular to the optical axis of said illumination system.

25. The apparatus according to claim 21,
wherein opposed faces of said parallel plates have sinusoidally varying profiles to provide said sinusoidally varying refractive power.

\* \* \* \* \*